United States Patent
Lee et al.

(10) Patent No.: US 8,420,927 B2
(45) Date of Patent: Apr. 16, 2013

(54) SOLAR CELL, METHOD OF MANUFACTURING THE SAME, AND SOLAR CELL MODULE

(75) Inventors: Younghyun Lee, Seoul (KR); Jungmin Ha, Seoul (KR); Junyong Ahn, Seoul (KR); Jinhyung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/839,087

(22) Filed: Jul. 19, 2010

(65) Prior Publication Data

US 2011/0094567 A1 Apr. 28, 2011

(30) Foreign Application Priority Data

Oct. 26, 2009 (KR) .................. 10-2009-0101721

(51) Int. Cl.
*H01L 31/048* (2006.01)
*H01L 31/02* (2006.01)
*H01L 31/18* (2006.01)

(52) U.S. Cl.
USPC .................. 136/251; 136/256; 257/E31.127; 438/72

(58) Field of Classification Search .................. 427/125
See application file for complete search history.

(56) References Cited

U.S. PATENT DOCUMENTS

| 4,204,107 A | * | 5/1980 | Ohkubo et al. ............... 347/204 |
| 5,041,391 A | * | 8/1991 | Ono ................................. 438/80 |
| 5,145,793 A | * | 9/1992 | Oohara et al. .................. 438/94 |
| 5,151,377 A | * | 9/1992 | Hanoka et al. ................. 438/98 |
| RE37,512 E | * | 1/2002 | Szlufcik et al. ................. 438/57 |
| 2007/0209697 A1 | * | 9/2007 | Karakida et al. .............. 136/256 |

FOREIGN PATENT DOCUMENTS

| EP | 1 887 633 A1 | 2/2008 |
| EP | 2 068 369 A1 | 6/2009 |
| JP | 2000-340812 A | 12/2000 |
| JP | 2005-101426 A | 4/2005 |
| JP | 2009-16713 A | 1/2009 |

\* cited by examiner

*Primary Examiner* — Jennifer Michener
*Assistant Examiner* — Magali P Slawski
(74) *Attorney, Agent, or Firm* — Birch, Stewart, Kolasch & Birch, LLP (57) ABSTRACT

A solar cell and a solar cell module including the solar cells are disclosed. The solar cell includes a substrate of a first conductive type; an emitter layer of a second conductive type positioned at a light receiving surface of the substrate; a plurality of first electrodes that are positioned on the emitter layer and are electrically connected to the emitter layer; and at least one first current collector that is positioned on the emitter layer in a direction crossing the plurality of first electrodes, wherein a thickness of each of the plurality of first electrodes is different from a thickness of the at least one first current collector, and a difference of the thickness of the each first electrode to the thickness of the at least one current collector is equal to or less than about 0.5 times the thickness of the at least one first current collector.

7 Claims, 9 Drawing Sheets

|  | W3 = 1.5mm<br>W4 = 100μm | W3 = 1.5mm<br>W4 = 60μm | W3 = 1.5mm<br>W4 = 40μm |
|---|---|---|---|
| W1 | 120μm ~ 130μm | 70μm ~ 80μm | 50μm ~ 60μm |
| T1 | 15μm ~ 20μm | 10μm | 9μm |
| T2 | 15μm ~ 20μm | 15μm ~ 20μm | 15μm ~ 20μm |

SOLAR CELL, METHOD OF MANUFACTURING THE SAME, AND SOLAR CELL MODULE

This application claims priority to and the benefit of Korean Patent Application No. 10-2009-0101721 filed in the Korean Intellectual Property Office on Oct. 26, 2009, the entire contents of which are incorporated herein by reference.

BACKGROUND OF THE INVENTION

1. Field of the Invention

Embodiments of the invention relate to a solar cell, a method of manufacturing the same, and a solar cell module including a plurality of solar cells.

2. Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A solar cell generally includes a substrate and an emitter layer which are respectively formed of different conductive type semiconductors, for example, p-type and n-type semiconductors. In this case, the emitter layer is positioned in a light receiving surface of the substrate, and a p-n junction is formed at an interface between the substrate and the emitter layer. A plurality of first electrodes electrically connected to the emitter layer is positioned on the emitter layer, and a plurality of second electrodes electrically connected to the substrate is positioned on a surface opposite the light receiving surface of the substrate.

When light is incident on the solar cell, electrons inside the semiconductors become free electrons (hereinafter referred to as "electrons") by the photoelectric effect. Further, electrons and holes respectively move to the n-type semiconductor (e.g., the emitter layer) and the p-type semiconductor (e.g., the substrate) in accordance with the principle of the p-n junction. The electrons moving to the emitter layer and the holes moving to the substrate are respectively collected by the first electrodes and the second electrodes respectively connected to the emitter layer and the substrate.

At least one current collector, for example, at least one bus bar is positioned on each of the substrate and the emitter layer. The current collector on the substrate and the current collector on the emitter layer are electrically connected to the second electrodes on the substrate and the first electrodes on the emitter layer, respectively.

However, a light receiving area of the solar cell having the above-described configuration decreases because of the first electrodes on the emitter layer and the at least one bus bar for electrically connecting the first electrodes.

SUMMARY OF THE INVENTION

In one aspect, there is a solar cell including a substrate of a first conductive type; an emitter layer of a second conductive type positioned at a light receiving surface of the substrate; a plurality of first electrodes that are positioned on the emitter layer and are electrically connected to the emitter layer; and at least one first current collector that is positioned on the emitter layer in a direction crossing the plurality of first electrodes, wherein a thickness of each of the plurality of first electrodes is different from a thickness of the at least one first current collector, and a difference of the thickness of the each first electrode to the thickness of the at least one current collector is equal to or less than about 0.5 times the thickness of the at least one first current collector.

In another aspect, there is method of manufacturing a solar cell, the method including forming a conductive material on an anti-reflection layer of a substrate to form a plurality of first electrodes and at least one first current collector; and firing the conductive material, wherein a thickness of each of the plurality of first electrodes is different from a thickness of the at least one first current collector, and a difference of the thickness of the each first electrode to the thickness of the at least one current collector is equal to or less than about 0.5 times the thickness of the at least one first current collector.

A solar cell module including a plurality of solar cells; an interconnector for electrically connecting the plurality of solar cells to one another; upper and lower protective layers for protecting the plurality of solar cells; a transparent member positioned on the upper protective layer; and a back sheet positioned under the lower protective layer, wherein each of the plurality of solar cells includes: an emitter layer of a second conductive type positioned at a light receiving surface of a substrate of a first conductive type; a plurality of first electrodes that are positioned on the emitter layer and are electrically connected to the emitter layer; at least one first current collector that is positioned on the emitter layer in a direction crossing the plurality of first electrodes, a thickness of each of the plurality of first electrodes is different from a thickness of the at least one first current collector, and a difference of the thickness of the each first electrode to the thickness of the at least one current collector is equal to or less than about 0.5 times the thickness of the at least one first current collector; and an anti-reflection layer positioned on the emitter layer on which the plurality of first electrodes and the at least one first current collector are not positioned.

Accordingly, because an area of the first electrodes on the emitter layer decreases, a light receiving area of the solar cell increases. Hence, efficiency of the solar cell is improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 1:
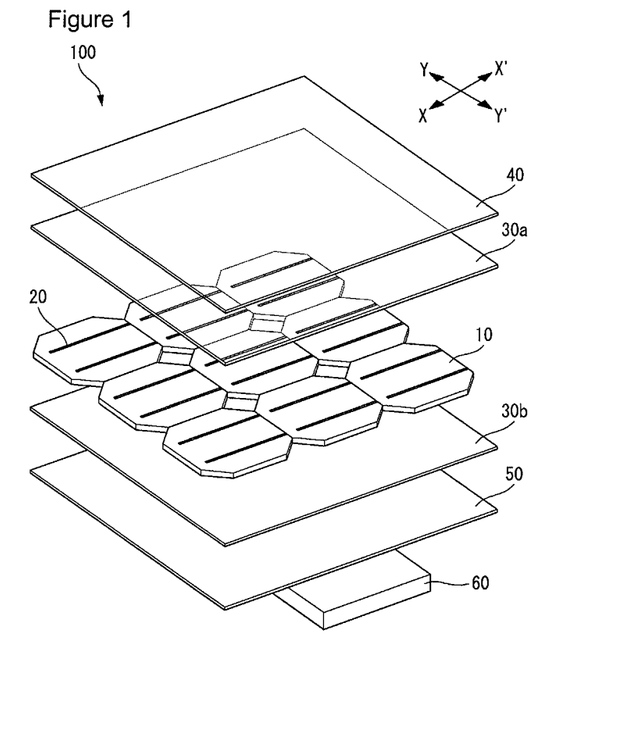
FIG. 1 is an exploded perspective view of a solar cell module according to an embodiment of the invention.

FIG. 1 is an exploded perspective view of a solar cell module according to an embodiment of the invention. As shown in FIG. 1, a solar cell module 100 according to an embodiment of the invention includes a plurality of solar cells 10, an interconnector 20 for electrically connecting the solar cells 10 to one another, upper and lower protective layers 30a and 30b for protecting the solar cells 10, a transparent member 40 on the upper protective layer 30a that is positioned near to light receiving surfaces of the solar cells 10, a back sheet 50 underlying the lower protective layer 30b that is positioned near to surfaces opposite the light receiving surfaces of the solar cells 10, a frame receiving the components 10, 20, 30a, 30b, 40, and 50 that form an integral body through a lamination process, and a junction box 60 collecting a current and a voltage generated by the solar cells 10.

The back sheet 50 prevents moisture or oxygen from penetrating into a back surface of the solar cell module 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

The upper and lower protective layers 30a and 30b and the solar cells 10 form an integral body when a lamination process is performed in a state where the upper and lower protective layers 30a and 30b are respectively positioned on and under the solar cells 10. The upper and lower protective layers 30a and 30b prevent corrosion of metal resulting from the moisture penetration and protect the solar cells 10 from an impact. The upper and lower protective layers 30a and 30b may be formed of ethylene vinyl acetate (EVA). Other materials may be used.

The transparent member 40 on the upper protective layer 30a is formed of a tempered glass having a high light transmittance and excellent damage prevention characteristic. The tempered glass may be a low iron tempered glass containing a small amount of iron. The transparent member 40 may have an embossed inner surface so as to increase a scattering effect of light.

Figure 2:
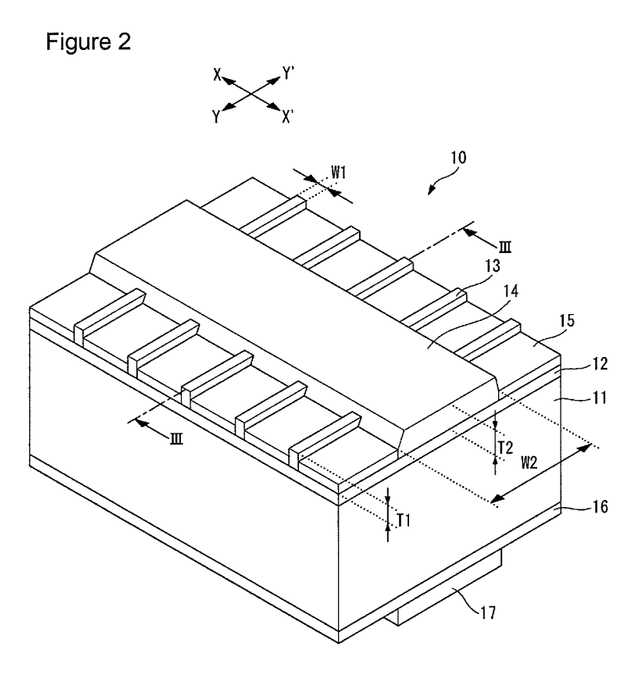
FIG. 2 is a partial perspective view of a solar cell according to an embodiment of the invention.
Figure 3:
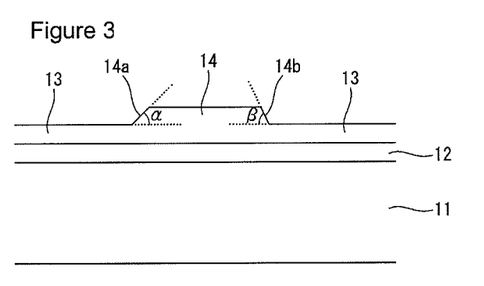
FIG. 3 is a partial cross-sectional view taken along line of FIG. 2.

FIG. 2 is a partial perspective view of the solar cell 10 shown in FIG. 1, and FIG. 3 is a partial cross-sectional view taken along line of FIG. 2.

As shown in FIG. 2, the solar cell 10 includes a substrate 11, an emitter layer 12 positioned in a light receiving surface of the substrate 11 on which light is incident, a plurality of first electrodes 13 positioned on the emitter layer 12, at least one first current collector 14 that is positioned on the emitter layer 12 in a direction crossing the first electrodes 13, an anti-reflection layer 15 positioned on the emitter layer 12 on which the first electrodes 13 and the first current collector 14 are not positioned, a second electrode 16 positioned on a surface opposite the light receiving surface of the substrate 11, and a second current collector 17 positioned on the second electrode 16.

The solar cell 10 may further include a back surface field (BSF) layer between the second electrode 16 and the substrate 11. The back surface field layer is a region (e.g., a $p^+$-type region) that is more heavily doped with impurities of the same conductive type as the substrate 11 than the substrate 11. The back surface field layer serves as a potential barrier of the substrate 11. Thus, because a recombination and/or a disappearance of electrons and holes around the back surface of the substrate 11 are prevented or reduced, the efficiency of the solar cell 10 is improved.

The substrate 11 is a semiconductor substrate formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics. When the surface of the substrate 11 is the textured surface, a light reflectance in the light receiving surface of the substrate 11 is reduced. Further, because both a light incident operation and a light reflection operation are performed on the textured surface of the substrate 11, light is confined in the solar cell 10. Hence, a light absorption increases, and efficiency of the solar cell 10 is improved. In addition, because a reflection loss of light incident on the substrate 11 decreases, an amount of light incident on the substrate 11 further increases.

The emitter layer 12 is an impurity region doped with impurities of a second conductive type (for example, an n-type) opposite the first conductive type of the substrate 11. The emitter layer 12 forms a p-n junction along with the substrate 11. When the emitter layer 12 is of the n-type, the emitter layer 12 may be formed by doping the substrate 11 with impurities of a group V element such as phosphor (P), arsenic (As), and antimony (Sb).

When energy produced by light incident on the substrate 11 is applied to carriers inside the semiconductors, electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this case, electrons move to the substrate 11 and holes move to the emitter layer 12.

When the emitter layer 12 is of the p-type, the emitter layer 12 may be formed by doping the substrate 11 with impurities of a group III element such as boron (B), gallium (Ga), and indium (In).

The anti-reflection layer 15 on the emitter layer 12 may be formed of silicon nitride (SiNx) and/or silicon dioxide (SiO2). The anti-reflection layer 15 reduces a reflectance of light incident on the solar cell 10 and increases a selectivity of a predetermined wavelength band, thereby increasing the efficiency of the solar cell 10. The anti-reflection layer 15 may have a thickness of about 70 nm to 80 nm. The anti-reflection layer 15 may be omitted, if desired.

The plurality of first electrodes 13 on the emitter layer 12 are electrically connected to the emitter layer 12 and are formed in one direction, for example, in an Y-Y' direction, to be spaced apart from one another, for example, in the X-X' direction. Each of the first electrodes 13 collects carriers (e.g., electrons) moving to the emitter layer 12 and transfers the carriers to the first current collector 14. Each of the first electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the first electrodes 13.

The at least one first current collector 14 is positioned on the emitter layer 12. The first current collector 14 referred to as a bus bar is formed in a direction crossing the first electrodes 13, for example, in an X-X' direction. Thus, the first electrodes 13 and the first current collector 14 are positioned on the emitter layer 12 in a crossing structure. The first current collector 14 is electrically connected to the emitter layer 12 and the first electrodes 13. Thus, the first current collector 14 outputs the carriers (e.g., electrons) transferred from the first electrodes 13 to an external device. The first current collector 14 is formed of at least one conductive material. The conductive material may be at least one selected from the group consisting of Ni, Cu, Ag, Al, Sn, Zn, In, Ti, Au, and a combination thereof. Other conductive materials may be used for the first current collector 14.

In the embodiment of the invention, the first current collector 14 may contain the same material as or a different material than the first electrodes 13.

For example, the first electrodes 13 and the first current collector 14 may be formed of (or include) an Ag paste and/or a glass frit. At least one of the Ag pasted and the glass frit may contain lead (Pb). In this case, the first electrodes 13 and the first current collector 14 may be electrically connected to the emitter layer 12 in a process in which the Ag paste is coated on the anti-reflection layer 15 using a screen printing method and the substrate 11 is fired at a temperature of about 750° C. to 800° C. The electrical connection between the first electrodes 13 and the first current collector 14 and the emitter layer 12 is performed by etching the anti-reflection layer 15 using Pb contained in the Ag paste and/or the glass frit in the firing process and then bringing Ag particles of the Ag paste into contact with the emitter layer 12.

In an embodiment of the invention, first electrode 13 may have a multi-layered structure such as a double-layered structure, so as to increase the thickness of the first electrode 13. For example, the first electrode 13 may include a lower layer and an upper layer disposed on the lower layer. The lower layer and/or the first current collector 14 may include an Ag paste and/or a glass frit. The upper layer of the first electrode 13 may be a plating layer (or an electroplated layer), and the lower layer of the first electrode 13 may serve as a seed layer.

The second electrode 16 is positioned on the surface (i.e., a lower surface of the substrate 11) opposite the light receiving surface of the substrate 11. The second electrode 16 collects carriers (e.g., holes) moving to the substrate 11. The second electrode 16 is formed of at least one conductive material. The conductive material may be at least one selected from the group consisting of Ni, Cu, Ag, Al, Sn, Zn, In, Ti, Au, and a combination thereof. Other conductive materials may be used for the second electrode 16.

The second current collector 17 is positioned under the second electrode 16. The second current collector 17 is formed in a direction crossing the first electrodes 13, i.e., in a direction parallel to the first current collector 14. The second current collector 17 is electrically connected to the second electrode 16. Thus, the second current collector 17 outputs the carriers (e.g., holes) transferred from the second electrode 16 to the external device. The second current collector 17 is formed of at least one conductive material. The conductive material may be at least one selected from the group consisting of Ni, Cu, Ag, Al, Sn, Zn, In, Ti, Au, and a combination thereof. Other conductive materials may be used for the second current collector 17.

In the solar cell 10 having the above-described configuration, the first electrode 13 has a linewidth W1 that is equal to or greater than about 25 μm and less than about 100 μm, and a thickness of the first electrode 13 is different from a thickness of the first current collector 14. More specifically, in the embodiment of the invention, a thickness T1 of the first electrode 13 is equal to or greater than one half of (or 0.5 times) a thickness T2 of the first current collector 14 and is less than the thickness T2 of the first current collector 14. (claimed feature).

As shown in FIGS. 2 and 3, a connection portion of the first electrode 13 and the first current collector 14 includes a first inclined surface 14a and a second inclined surface 14b, and inclined angles of the first and second inclined surfaces 14a and 14b are different from each other. For example, when the Ag paste is printed in an Y→Y' direction, an inclined angle α of the first inclined surface 14a is less than an inclined angle β of the second inclined surface 14b. On the contrary, when the Ag paste is printed in a Y'→Y direction, the inclined angle α of the first inclined surface 14a is greater than the inclined angle β of the second inclined surface 14b.

Figure 4:
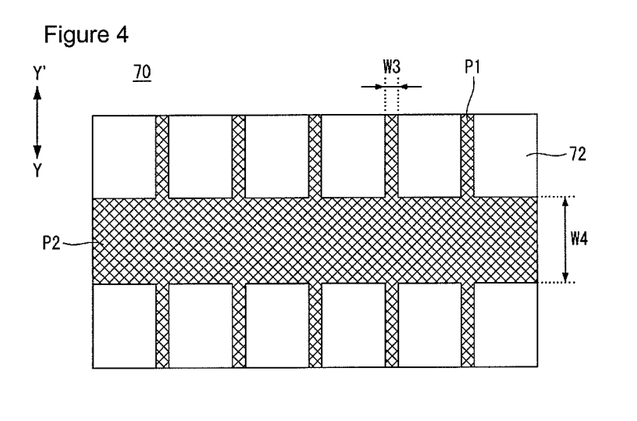
FIG. 4 is a plane view of a screen mesh used to form a first electrode and a first current collector of a solar cell.
Figure 5:
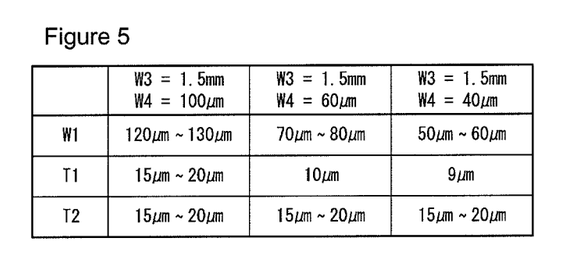
FIG. 5 is a table indicating a thickness based on a linewidth of a first electrode.
Figure 6:
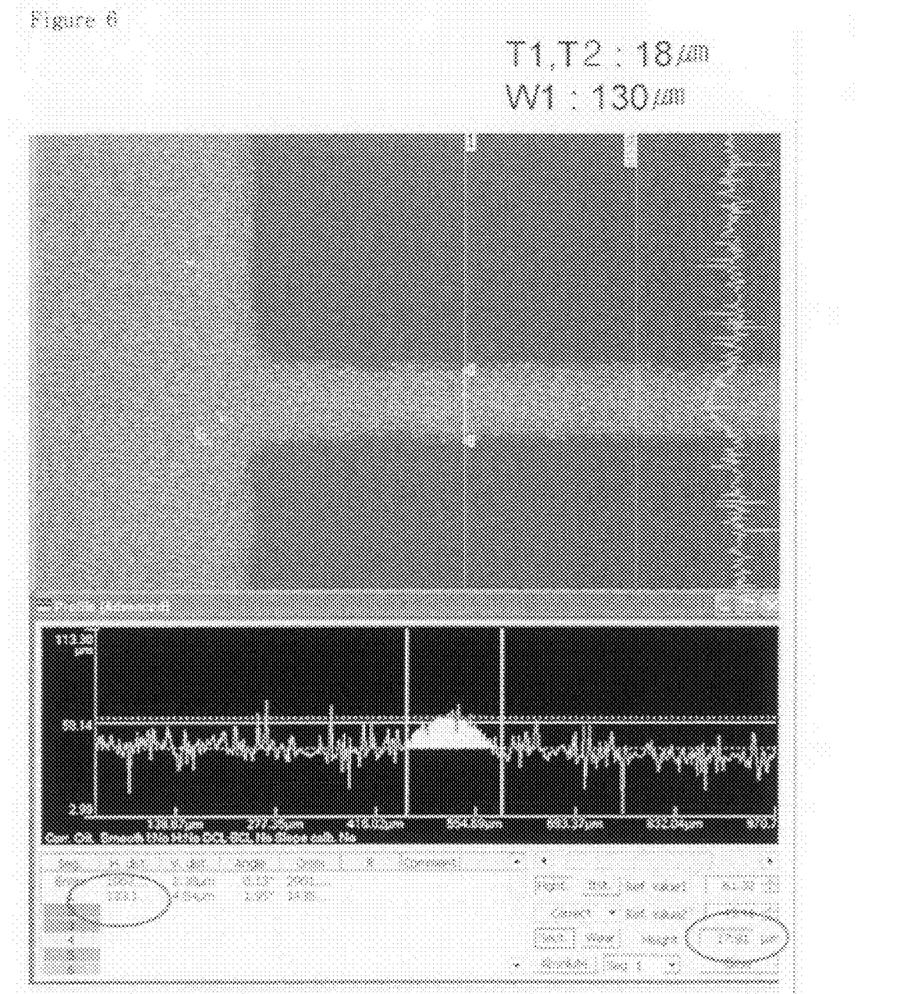
FIGS. 6 to 8 are experimental examples indicating a thickness based on a linewidth of a first electrode.
Figure 7:
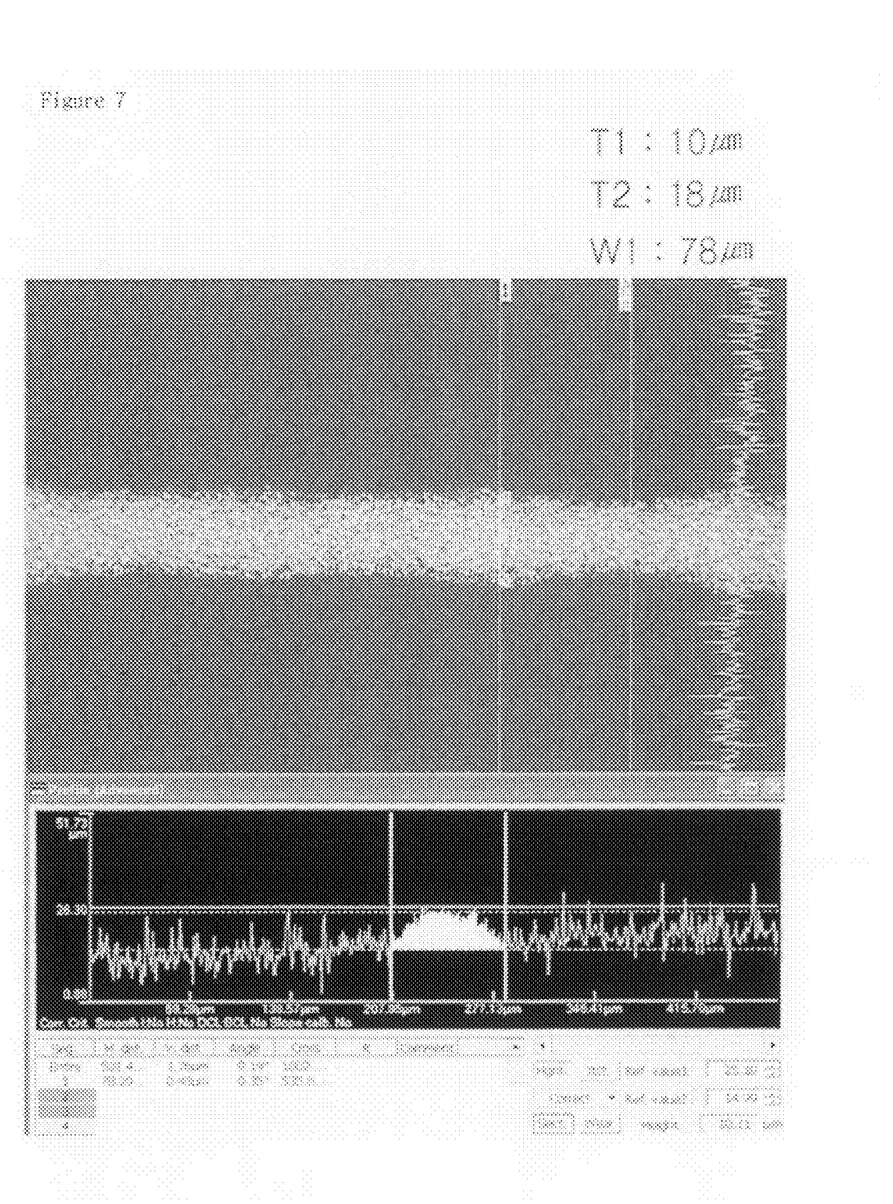
Figure 8:
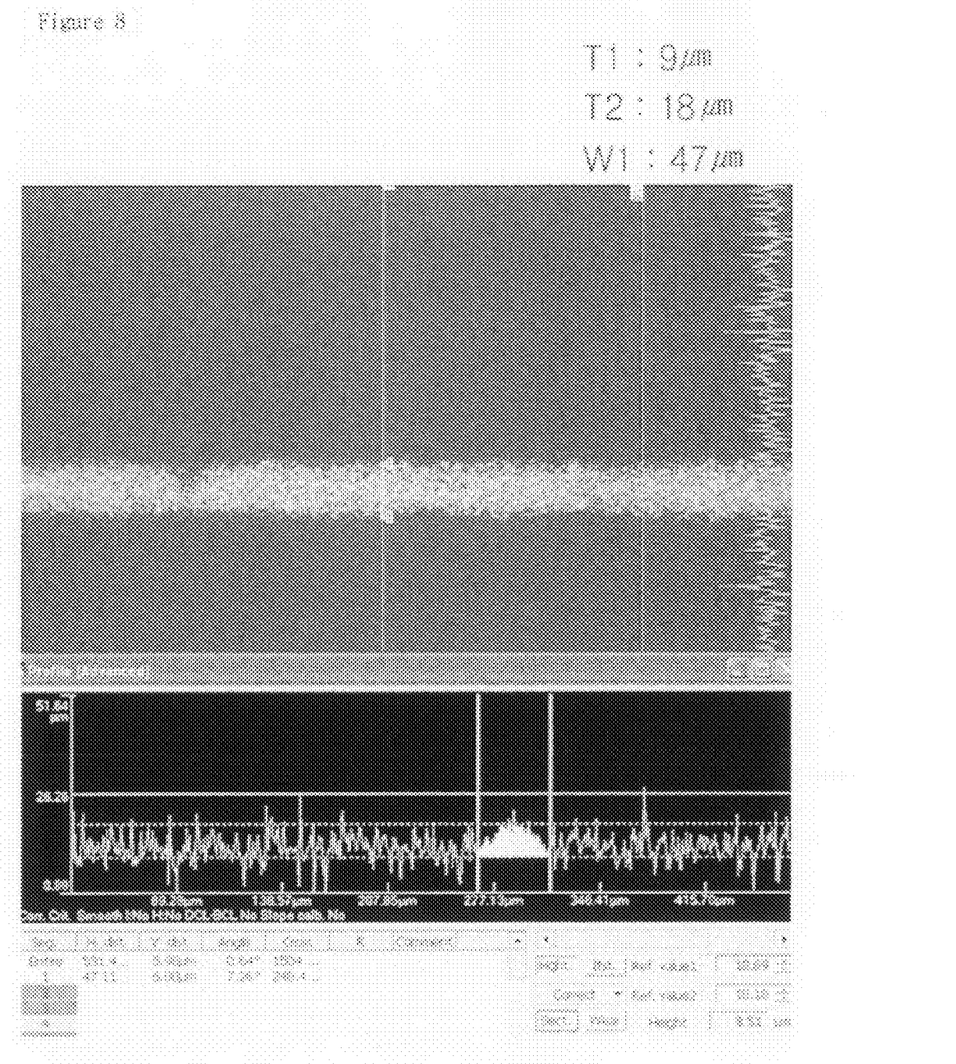

A method of manufacturing the solar cell according to the embodiment of the invention is described below with reference to FIG. 2 and FIGS. 4 to 8. FIG. 4 is a plane view of a screen mesh used to form the first electrode and the first current collector. FIG. 5 is a table indicating a thickness based on a linewidth of the first electrode. FIGS. 6 to 8 are experimental examples indicating a thickness based on a linewidth of the first electrode.

The method of manufacturing the solar cell according to the embodiment of the invention includes printing and firing the plurality of first electrodes 13 and the at least one first current collector 14 on the anti-reflection layer 15 of the substrate 11 on which the emitter layer 12 and the anti-reflection layer 15 are sequentially stacked.

A screen mesh 70 is used to form the first electrodes 13 and the first current collector 14. The screen mesh 70 has a first electrode pattern P1 corresponding to the first electrodes 13 and a first current collector pattern P2 corresponding to the first current collector 14. The screen mesh 70 includes a mesh net, a pattern forming layer 72 positioned in an upper part or a lower part of the mesh net, a frame for fixing the mesh net. The pattern forming layer 72 forms the first electrode pattern P1 and the first current collector pattern P2.

The mesh net has a net structure formed using threads each having a fixed thickness. The size of each of openings formed between the threads varies depending on the thickness of the threads, the number of threads existing in the unit area, and the like.

The pattern forming layer 72 may be formed by coating and hardening an emulsion on the mesh net and then removing the emulsion existing in an area of the first electrode pattern P1 and an area of the first current collector pattern P2 using a pattern mask.

As above, even if a printing process is performed once using the screen mesh 70 having the first electrode pattern P1 and the first current collector pattern P2, the first electrodes 13 and the first current collector 14 can be simultaneously printed.

Further, the Ag paste and/or glass frit containing Pb may be used to form the first electrodes 13 and the first current collector 14. A method for forming the first electrodes 13 and the first current collector 14 using the screen mesh 70 is described below.

The Ag paste is coated using a screen printing process to form the first electrodes 13 and the first current collector 14. In this case, when the linewidth W1 of the first electrode 13 is set to be equal to or greater than about 25 μm and less than about 100 μm, the thickness T1 of the first electrode 13 may be equal to or greater than one half of the thickness T2 of the first current collector 14 and may be less than the thickness T2. A difference between the thicknesses T1 and T2 is caused by a difference between the linewidth W1 of the first electrode 13 and a linewidth W2 of the first current collector 14.

For example, as shown in FIGS. 5 and 6, when the screen printing process is performed using the screen mesh 70 in which a linewidth W4 of the first current collector pattern P2 and a linewidth W3 of the first electrode pattern P1 are respectively set at 1.5 mm and 100 μm, the linewidth W1 of the first electrode 13 is approximately 120 μm to 130 μm, the thickness T1 of the first electrode 13 is equal to the thickness T2 of the first current collector 14, the thicknesses T1 and T2 are approximately 15 μm to 20 μm. FIG. 6 illustrates that the thickness T1 of the first electrode 13 and the thickness T2 of the first current collector 14 are approximately 18 μm.

The linewidth W1 of the first electrode 13 and the linewidth W2 of the first current collector 14 are slightly greater than the linewidth W3 of the first electrode pattern P1 and the linewidth W4 of the first current collector pattern P2 due to a spread phenomenon of the Ag paste. The spread of the Ag paste may vary depending on a viscosity of the Ag paste.

As shown in FIGS. 5 and 7, when the screen printing process is performed using the screen mesh 70 in which the linewidth W4 of the first current collector pattern P2 and the linewidth W3 of the first electrode pattern P1 are respectively set at 1.5 mm and 60 μm, the linewidth W1 of the first electrode 13 is approximately 70 μm to 80 μm and the thickness T1 of the first electrode 13 is approximately 10 μm.

As shown in FIGS. 5 and 8, when the screen printing process is performed using the screen mesh 70 in which the linewidth W4 of the first current collector pattern P2 and the linewidth W3 of the first electrode pattern P1 are respectively set at 1.5 mm and 40 μm, the linewidth W1 of the first electrode 13 is approximately 50 μm to 60 μm and the thickness T1 of the first electrode 13 is approximately 9 μm.

FIGS. 5 to 8 illustrate the results obtained when the linewidth W3 of the first electrode pattern P1 changes to 100 μm, 60 μm, and 40 μm in a state where the linewidth W4 of the first current collector pattern P2 is fixed at 1.5 mm.

As above, when the linewidth W3 of the first electrode pattern P1 is equal to or greater than about 25 μm and less than about 100 μm, the thickness T1 of the first electrode 13 is equal to or greater than one half of the thickness T2 of the first current collector 14 and is less than the thickness T2.

When the linewidth W3 of the first electrode pattern P1 is less than about 25 μm, the thickness T1 of the first electrode 13 is less than one half of the thickness T2 of the first current collector 14. Hence, a contact resistance of the first electrode 13 increases, and the first electrode 13 may be disconnected. Further, in this case, Ag particles contained in the Ag paste in an area of the first current collector 14 penetrate into the substrate 11 in a firing process of the first electrode 13 and the first current collector 14, thereby generating shunt.

Figure 9A:
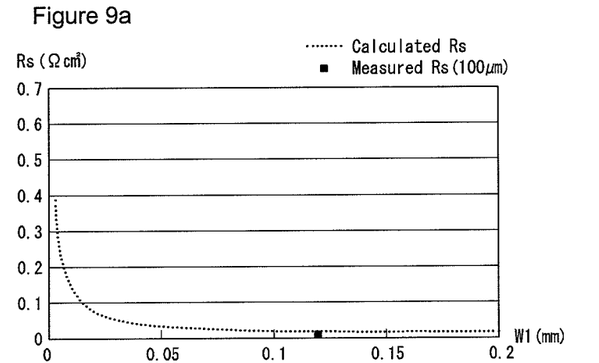
FIGS. 9A to 9C are graphs indicating changes in a contact resistance based on a linewidth of a first electrode.
Figure 9B:
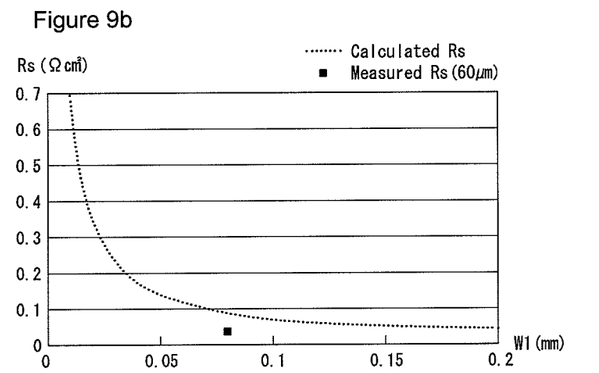
Figure 9C:
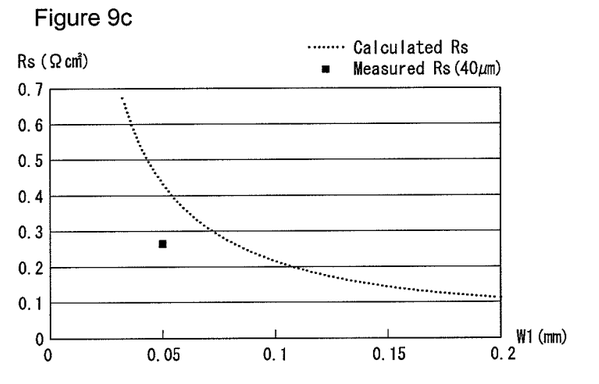

FIGS. 9A to 9C are graphs illustrating a contact resistance Rs of the first electrode 13 measured when the linewidth W3 of the first electrode pattern P1 is respectively set at about 100 μm, 60 μm, and 40 μm. As shown in FIGS. 9A to 9C, as the linewidth W1 of the first electrode 13 decreases, the contact resistance Rs of the first electrode 13 increases. According to an experiment of the present inventors, when the linewidth W3 of the first electrode pattern P1 was set at about 100 μm, 60 μm, and 40 μm, the contact resistance Rs of the first electrode 13 was measured at 0.008 $\Omega cm^2$, 0.044 $\Omega cm^2$, and 0.266 $\Omega cm^2$.

As above, the reason why the linewidth W1 of the first electrode 13 is inversely proportional to the contact resistance Rs of the first electrode 13 is that an etching of the anti-reflection layer 15 in the area of the first electrode 13 is badly performed because an amount of Pb contained in the Ag paste in an area of the first electrode 13 is less than an amount of Pb contained in the Ag paste in the area of the first current collector 14.

When the linewidth W1 of the first electrode 13 is equal to or greater than 100 μm, a light receiving area of the solar cell 10 decreases because of an increase in the linewidth W1 of the first electrode 13. Hence, the efficiency of the solar cell 10 is reduced.

Accordingly, when the linewidth W3 of the first electrode pattern P1 is equal to or greater than about 25 μm and less than about 100 μm, the thickness T1 of the first electrode 13 is equal to or greater than one half of the thickness T2 of the first current collector 14 and is less than the thickness T2. Hence, the light receiving area of the solar cell 10 can increase while preventing an increase in the contact resistance of the first electrode 13, the shunt generation in the area of the first current collector 14, and the disconnection of the first electrode 13.

Further, when the Ag paste is printed in a longitudinal direction (i.e., an Y-Y' direction) of the first electrode 13 in a formation process of the first electrode 13 and the first current collector 14, the disconnection of the first electrode 13 having the linewidth W1 less than the first current collector 14 may be prevented.

When the first electrode 13 and the first current collector 14 are formed according to the method described above, the connection portion of the first electrode 13 and the first current collector 14 includes the first inclined surface 14a and the second inclined surface 14b as shown in FIGS. 2 and 3. As shown in FIG. 3, when the Ag paste is printed in the Y→Y' direction, the inclined angle α of the first inclined surface 14a may be less than the inclined angle β of the second inclined surface 14b. On the contrary, when the Ag paste is printed in the opposite direction (i.e., in the Y'→Y direction) to the Y→Y' direction, the inclined angle α of the first inclined surface 14a may be greater than the inclined angle β of the second inclined surface 14b.

The above-described solar cells 10 may be individually used. In addition, the plurality of solar cells 10 having the same structure may be electrically connected in series and/or in parallel to one another to form the solar cell module 100 for the efficient use of the solar cells 10.

Figure 10:
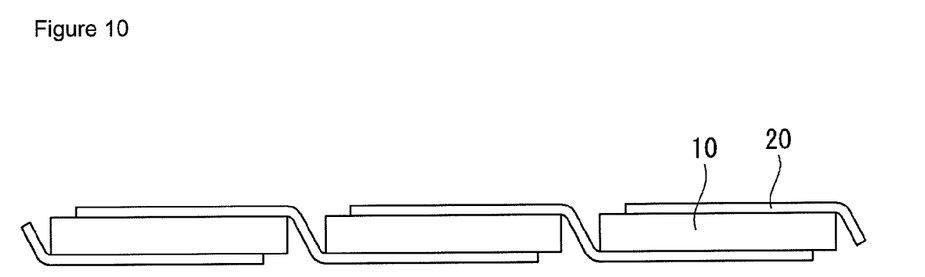
FIG. 10 is a lateral view illustrating an electrical connection structure between solar cells of the solar cell module shown in FIG. 1.

FIG. 10 is a lateral view illustrating an electrical connection structure between the solar cells according to the embodiment of the invention.

The plurality of solar cells 10 are arranged in a matrix structure as shown in FIG. 1. Although FIG. 1 illustrates that the solar cells 10 on the lower passivation layer 30b have a structure of 3×3 matrix, the number of solar cells 10 in row and/or column directions may vary, if necessary.

The plurality of solar cells 10 are electrically connected to one another using the interconnector 20. More specifically, as shown in FIG. 10, the first current collector 14 of one solar cell 10 of the plurality of solar cells 10 is electrically connected to the second current collector 17 of another solar cell adjacent to the one solar cell 10 using the interconnector 20 in a state where the plurality of solar cells 10 are positioned adjacently to one another.

The interconnector 20 may include a conductive metal part and a solder part. The solder part may be covered only on upper and lower surfaces of the conductive metal part or may be covered on the entire surface of the conductive metal part.

The conductive metal part may be formed of one of Cu, Al, and Ag with excellent conductivity. Other materials may be used for the conductive metal part. The solder part may be formed of SnPb containing Pb. The solder part may be formed Pb-free and not contain Pb, for example, one selected among Sn, SnAg, and SnBi, so as to prevent environmental pollution. Other materials may be used for the solder part.

Figure 11:
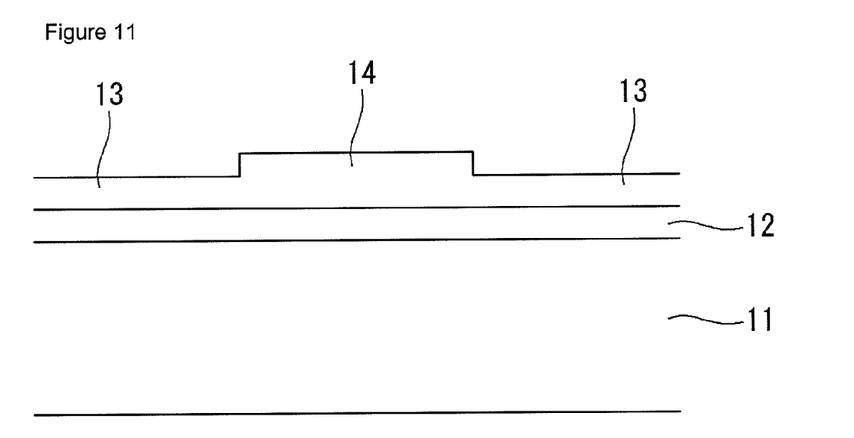
FIG. 11 is a partial perspective view of a solar cell according to another embodiment of the invention.

FIG. 11 is a partial cross-sectional view of a solar cell according to another embodiment of the invention. As shown in FIG. 11, a connection portion of a first electrode 13 and a first current collector 14 may be a perpendicular surface. Since configuration of the solar cell shown in FIG. 11 is substantially the same as the solar cell 10 described above, a further description may be briefly made or may be entirely omitted.

Figure 12:
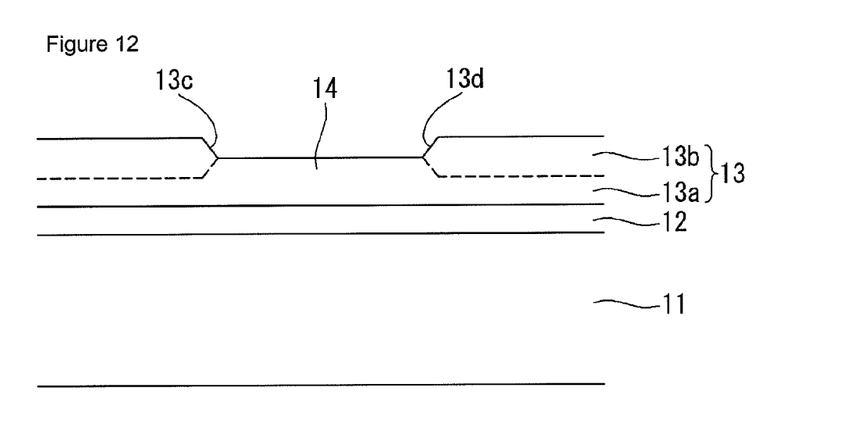
FIG. 12 is a partial perspective view of a solar cell according to another embodiment of the invention.

FIG. 12 is a partial cross-sectional view of a solar cell according to another embodiment of the invention. As shown in FIG. 12, a thickness of a first electrode 13 is greater than a thickness of a first current collector 14 and is equal to or less than 1.5 times the thickness of the first current collector 14. When the thickness of the first electrode 13 is greater than the thickness of the first current collector 14, an increase in a line resistance of the first electrode 13 can be reduced or prevented.

The first electrode 13 may have a multi-layered structure such as a double-layered structure, so as to increase the thickness of the first electrode 13. For example, the first electrode 13 may include a lower layer 13a formed of (or includes) an Ag paste and/or a glass frit, and an upper layer 13b on the lower layer 13a. The upper layer 13b may be a plating layer, and the lower layer 13a may serve as a seed layer. The first current collector 14 may also be formed of (or include) an Ag paste and/or a glass frit.

The upper layer 13b may be formed of at least one selected from the group consisting of copper (Cu), silver (Ag), aluminum (Al), tin (Sn), zinc (Zn), indium (In), titanium (Ti), gold (Au), and a combination thereof. Other conductive materials may be used.

The upper layer 13b may sequentially include a diffusion prevention layer, a copper layer, and a tin layer on the lower layer 13a. The diffusion prevention layer prevents junction degradation generated when Cu contained in the copper layer is diffused at a silicon interface through the Ag paste of the lower layer 13a. The copper layer substantially serves as an electrical wiring. The tin layer reduces or prevents oxidation of the copper layer and allows an interconnector to be smoothly soldered.

When the upper layer 13b includes another metal layer, that is not easily oxidized in the air and can be soldered along with the interconnector 20, other than the copper layer, the tin layer may be omitted.

Further, the Ag paste may be again printed on the lower layer 13a to form the first electrode 13, so that the first electrode 13 is thicker than the first current collector 14. As above, when the first electrode 13 is thicker than the first current collector 14, a connection portion of the lower layer 13a of the first electrode 13 and the first current collector 14 includes a third inclined surface 13c and a fourth inclined surface 13d. The third and fourth inclined surfaces 13c and 13d may be the same as or different from the first and second inclined surfaces 14a and 14b. Further, a connection portion of the upper layer 13b of the first electrode 13 and the first current collector 14 has an opposite shape to the third and fourth inclined surfaces 13c and 13d and is inclinedly formed.

In an embodiment of the invention, the first electrode 13 that includes the upper layer 13b and the lower layer 13a is thicker than the first current collector 14, but the first current collector 14 has a thickness that is equal to or greater than a thickness of the upper layer 13b. On the other hand, a thickness of the upper layer 13b may have a thickness that is equal to or greater than a thickness of the first current collector 14.

In embodiments of the invention, a thickness of one or more of a plurality of first electrodes is different from a thickness of the at least one first current collector. For example, a thickness of the first electrode is equal to or greater than one half of (or 0.5 times) a thickness of the first current collector and is less than the thickness of the first current collector; and/or a thickness of a first electrode is greater than a thickness of a first current collector and is equal to or less than 1.5 times the thickness of the first current collector. Thus, a difference of the thickness of the each first electrode to the thickness of the at least one current collector is equal to or less than about 0.5 times the thickness of the at least one first current collector.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
   a substrate of a first conductive type;
   an emitter layer of a second conductive type positioned at a light receiving surface of the substrate;
   a plurality of first electrodes that are positioned on the emitter layer and are directly contacting the emitter layer; and at least one first current collector that is positioned on the emitter layer in a direction crossing the plurality of first electrodes, and are directly contacting the emitter layer, wherein each first electrode including a lower layer and an upper layer positioned on the lower layer, wherein a thickness of each first electrode is greater than a thickness of the at least one first current collector, a connection portion of the upper layer of each first electrode and each first current collector includes a first inclined surface having a first inclined angle and a second inclined surface facing the first inclined surface and having a second inclined angle different from the first inclined angle, the first inclined surface and the second inclined surface connecting a top surface of the upper layer and a top surface of each first current collector, each of the first and second inclined surfaces is inclinedly formed towards the top surface of the at least one first current collector, a thickness of each connection portion is thinner than the thickness of the first electrode, and wherein a distance measured on a vector normal between a top surface of the emitter layer and the top surface of the upper layer is larger than a distance measured on a vector normal between the top surface of the emitter layer and the top surface of the at least one first current collector.

2. The solar cell of claim 1, wherein inclined angles of the first and second inclined surfaces are less than 90 degrees.

3. The solar cell of claim 1, wherein the thickness of each first electrode is equal to or less than 1.5 times the thickness of the at least one first current collector.

4. The solar cell of claim 1, wherein a connection portion of the lower layer and the at least one first current collector includes a third inclined surface and a fourth inclined surface.

5. The solar cell of claim 3, wherein a linewidth of each first electrode is equal to or greater than about 25 µm and less than about 100 µm.

6. The solar cell of claim 1, wherein the lower layer of each first electrode and the at least one first current collector include silver (Ag) and a glass fit, and the glass frit contains lead (Pb).

7. The solar cell of claim 1, wherein the thickness of connection portion decreases in going from the first electrode towards the at least one first current collector.

* * * * *